(12) United States Patent
Clements et al.

(10) Patent No.: US 7,750,744 B2
(45) Date of Patent: Jul. 6, 2010

(54) SINGLE-ENDED TO DIFFERENTIAL TRANSLATOR TO CONTROL CURRENT STARVED DELAY CELL BIAS

(75) Inventors: Steven M. Clements, Raleigh, NC (US); Todd M. Rasmus, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 334 days.

(21) Appl. No.: 12/019,763

(22) Filed: Jan. 25, 2008

(65) Prior Publication Data

US 2009/0189701 A1  Jul. 30, 2009

(51) Int. Cl.
*H03B 27/00* (2006.01)
(52) U.S. Cl. .............................. 331/57; 331/16; 331/34; 331/177 R; 331/185
(58) Field of Classification Search .................... 331/16, 331/57, 34, 177 R, 185
See application file for complete search history.

(56) References Cited

U.S. PATENT DOCUMENTS

| | | | |
|---|---|---|---|
| 5,963,101 A * | 10/1999 | Iravani | 331/57 |
| 6,617,933 B2 * | 9/2003 | Ito et al. | 331/25 |
| 7,391,276 B2 * | 6/2008 | Sakaguchi | 331/57 |

* cited by examiner

*Primary Examiner*—Arnold Kinkead
(74) *Attorney, Agent, or Firm*—Dillon & Yudell LLP (57) ABSTRACT

A method, system, and circuit device for interfacing single-ended charge pump output to differential voltage controlled oscillator (VCO) inputs to yield low duty cycle distortion from a VCO. A single-ended charge pump output is utilized to create a compliment differential voltage leg, while optimally centering the common-mode voltage level to interface to a current starved ring VCO. A replica of the VCO's current starved delay cell is implemented along with negative feedback to generate the compliment differential voltage leg. The single-ended charge pump output is coupled to a first transistor, while a second transistor is coupled to the output of an error amplifier. The error amplifier utilizes negative feedback to bias the second transistor, forcing the output of the replica circuit to equal a reference voltage.

20 Claims, 6 Drawing Sheets

SINGLE-ENDED TO DIFFERENTIAL TRANSLATOR TO CONTROL CURRENT STARVED DELAY CELL BIAS

BACKGROUND

1. Technical Field

The present invention generally relates to phase locked loops and in particular to feedback circuits in phase-locked loop circuits.

2. Description of the Related Art

High speed serializers/deserializers (serdes) implement phased locked loops (PLLs) to frequency multiply an input reference clock to a frequency suitable for clocking transmitter and receiver functions. Often, PLLs utilized to frequency multiply should deliver low phase error, thereby multiple PLLs clocked from one reference clock will produce phase aligned output clocks relative to one another. The phase alignment of the output clocks allow multiple cores to be synchronized. An important aspect of PLL design is to keep potential sources of static phase offset as low as possible, thereby keeping the PLL phase error low. When PLLs are required to produce multiple output phases, maintaining low duty cycle distortion is also advantageous.

Many times the charge pump of a PLL is a significant source of phase offset. Differential charge pumps configure in a switched bridge topology are particularly vulnerable to device mismatch due to the charge pump's common-mode feedback. The common-mode feedback may not null out static error due to differences between the differential legs (creating a differential voltage). Properly designed single-ended charge pumps may yield very low static offsets, however many voltage controlled oscillators (VCOs) implement differential control voltage inputs.

SUMMARY OF ILLUSTRATIVE EMBODIMENTS

Disclosed are a method, system, and circuit device for optimally setting the common-mode voltage level of a charge pump to yield low duty cycle distortion from a voltage controlled oscillator (VCO). A single-ended charge pump output is utilized to create a compliment differential voltage, while optimally centering the common-mode voltage level to interface to a current starved ring VCO. A replica of the VCO's current starved delay cell is implemented along with negative feedback to generate the compliment differential voltage. The single-ended charge pump output is coupled to a first transistor, while a second transistor is coupled to the output of an error amplifier. The error amplifier utilizes negative feedback to bias the second transistor, forcing the output of the replica circuit to equal a reference voltage.

The above as well as additional features of the present invention will become apparent in the following detailed written description.

BRIEF DESCRIPTION OF THE DRAWINGS

The invention itself will best be understood by reference to the following detailed description of an illustrative embodiment when read in conjunction with the accompanying drawings, wherein.

DETAILED DESCRIPTION OF AN ILLUSTRATIVE EMBODIMENT

Disclosed are a method, system, and circuit device for optimally setting the common-mode voltage level of a charge pump to yield low duty cycle distortion from a voltage controlled oscillator (VCO). A single-ended charge pump output is utilized to create a compliment differential voltage, while optimally centering the common-mode voltage level to interface to a current starved ring VCO. A replica of the VCO's current starved delay cell is implemented along with negative feedback to generate the compliment differential voltage. The single-ended charge pump output is coupled to a first transistor, while a second transistor is coupled to the output of an error amplifier. The error amplifier utilizes negative feedback to bias the second transistor, forcing the output of the replica circuit to equal a reference voltage.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims.

Within the descriptions of the figures, similar elements are provided similar names and reference numerals as those of the previous figure(s). Where a later figure utilizes the element in a different context or with different functionality, the element is provided a different leading numeral representative of the figure number (e.g., 1xx for FIG. 1 and 2xx for FIG. 2). The specific numerals assigned to the elements are provided solely to aid in the description and not meant to imply any limitations (structural or functional) on the invention.

It is understood that the use of specific component, device and/or parameter names are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that terms is utilized.

Figure 1:
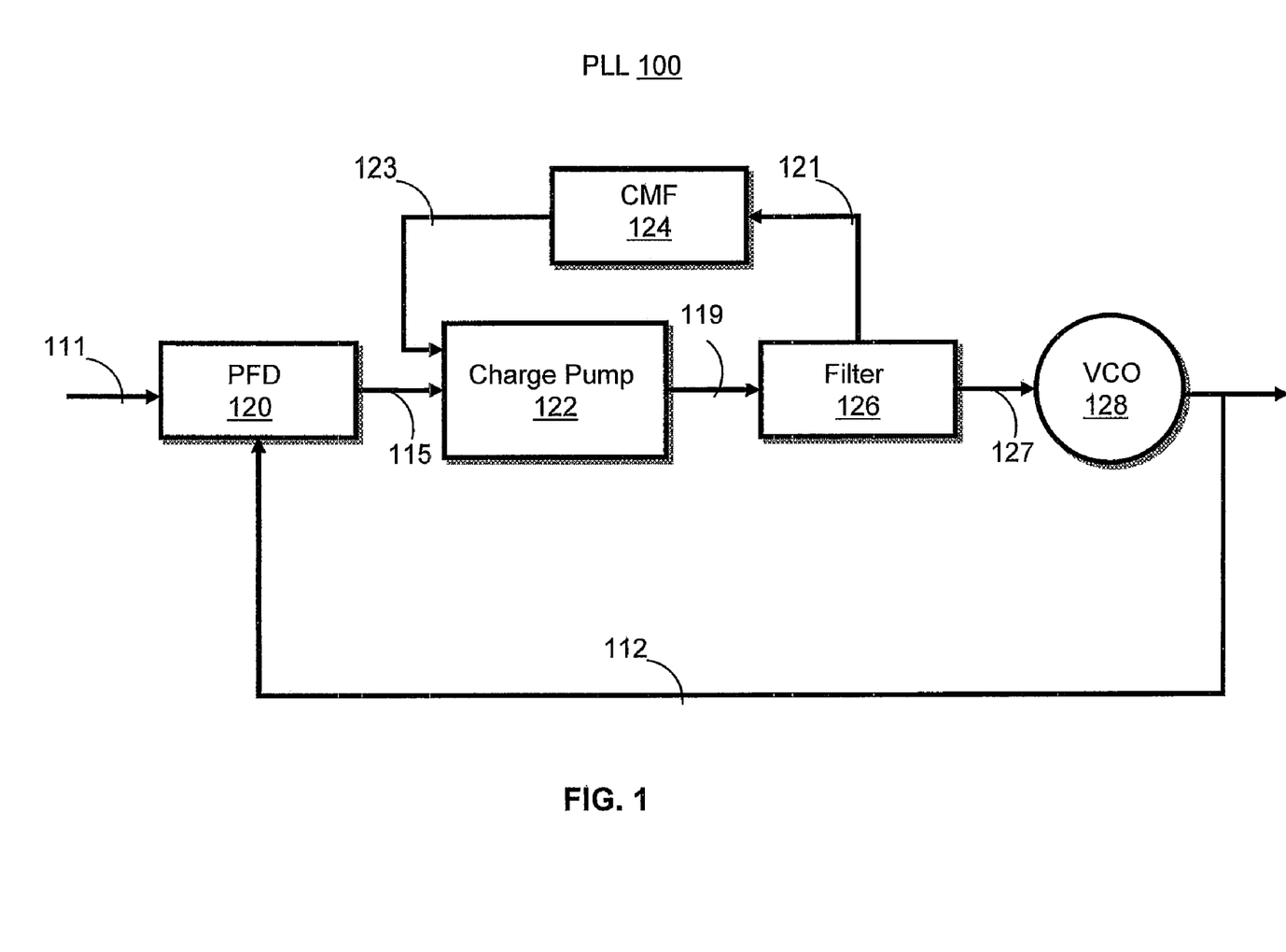
FIG. 1 is a block diagram of a phase locked loop utilizing a charge pump with common-mode feedback, according to one embodiment of the invention.

With reference now to the figures, FIG. 1 depicts a block diagram representation of a phase locked loop (PLL) system.

PLL 100 comprises a phase frequency detector (PFD) 120, charge pump 122, common-mode feedback (CMF) circuit 124, filter 126, and voltage controlled oscillator (VCO) 128. PFD 120 includes a first input for reference clock signal 111 and a second feedback signal 112. Multiple signals are produced within PLL 100: PFD output 115, charge pump differential signal 119, CMF input 121, common-mode feedback 123, and VCO input 127.

The output of PFD 120 is coupled to the input of charge pump 122. Charge pump differential output signal 119 is input into filter 126, and VCO input 127 is provided to VCO 128. Filter 126 also provides CMF input 121 to CMF circuit 124. CMF circuit 124 determines the common-mode voltage of charge pump differential output signal 119, and compares the common-mode voltage to a reference voltage. The difference of the common-mode voltage and a reference voltage (provided by the common-mode feedback circuit) is output from common-mode feedback circuit 124 and input to charge pump 122, as common-mode feedback signal 123. When common-mode feedback signal 123 is provided to charge pump 122, charge pump 122 may modify the common-mode voltage level of the signal, and provide an improved charge pump differential output signal 119.

Figure 2:
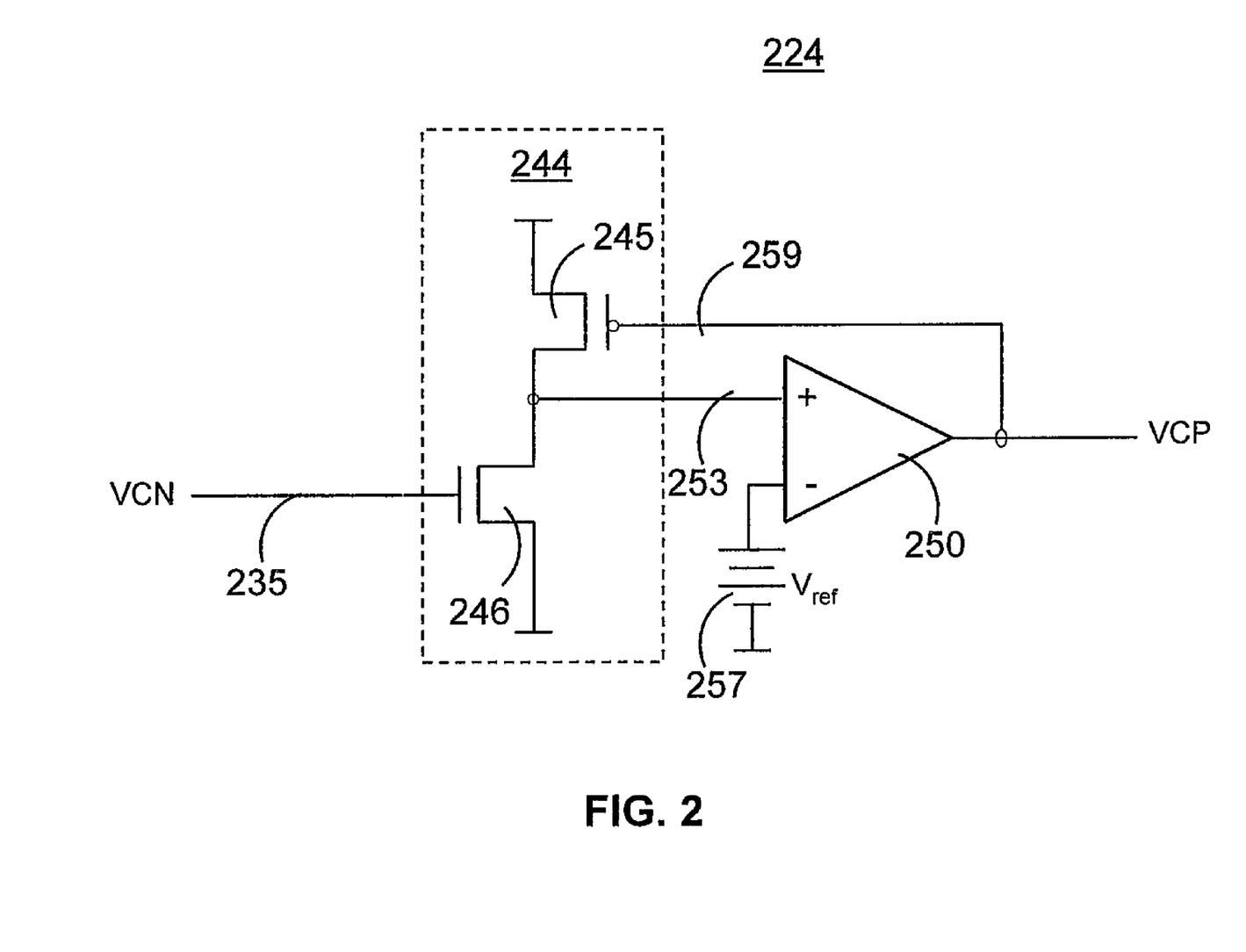
FIG. 2 is a block diagram of a common-mode feedback circuit utilizing a current starved voltage controlled oscillator (VCO) delay cell, in accordance with one embodiment of the invention.

With reference now to FIG. 2, where CMF circuit 224 comprises replica circuit 244 which includes PMOS (p-type) transistor 245 and NMOS (n-type) transistor 246, and error amplifier 250 which generates amplifier output 259 (also described herein as positive voltage control signal (VCP)). Error amplifier 350 has two inputs: a negative amplifier input signal of reference voltage (Vref) 257, and positive amplifier input voltage (or common mode feedback signal) 253. Negative voltage control signal (VCN) 235 is the output of a charge pump (illustrated in FIG. 3). As provided herein, VCP is the complement leg to VCN for the differential voltage.

In one embodiment, replica circuit 244 is a replica of a VCO's current starved delay cell. P-type transistor 245 and n-type transistor 246, within replica circuit 244, share the same transistor shape ratio, whereby p-type transistor 245 is equal to the dividend of the width (W) and length (L) of the transistor, multiplied by "K", wherein "K" is a constant and a factor of the device (transistor) parameters (p-type ratio=K*(W/L)). The n-type transistor ratio is equivalent to the dividend of the width and length of the transistor (n-type ratio=(W/L)). VCN 235 couples to the gate of n-type transistor 246. The output of n-type transistor 246, positive amplifier input voltage 253, couples to the positive input of error amplifier 250. Vref 257 couples to the negative input of error amplifier 250. Amplifier output 259 couples to the gate of p-type transistor 245.

In one embodiment, when positive amplifier input voltage (common mode feedback signal) 253 (which is provided at the inverter transition point) is high, the positive input for error amplifier 250 is greater than Vref 257. A high positive amplifier input voltage 253 forces amplifier output 259 to be positive. The positive common-mode feedback voltage 259 reduces the gate/source voltage of p-type transistor 245, thereby lowering the drain current of p-type transistor 245. P-type transistor 245 and r-type transistor 246 are connected in series via the drain. When the drain current of p-type transistor 245 is lowered, the output node of n-type transistor 246 pulls toward ground, or decreases (because the current of n-type transistor 245 is greater than the current of p-type transistor 246). Positive amplifier input voltage 253 continues to adjust, according to amplifier output 259, until positive amplifier input voltage 253 is equivalent to Vref 257.

In one embodiment, when positive amplifier input voltage 253 is low, the positive input for error amplifier 250 is less than Vref 257. A low positive amplifier input voltage 253 forces amplifier output 259 to be negative. The negative amplifier output 259 causes an increase in the drain current of p-type transistor 245. P-type transistor 245 and n-type transistor 246 are connected in series via the drain. When the drain current of p-type transistor 245 is increased, the output node of n-type transistor 246 pulls toward the supply voltage (not shown), or increases (because the current of n-type transistor 245 is less than the current of p-type transistor 246). Positive amplifier input voltage 253 continues to adjust, according to the amplifier output 259, until positive amplifier input voltage 253 is equivalent to Vref 257.

Figure 3:
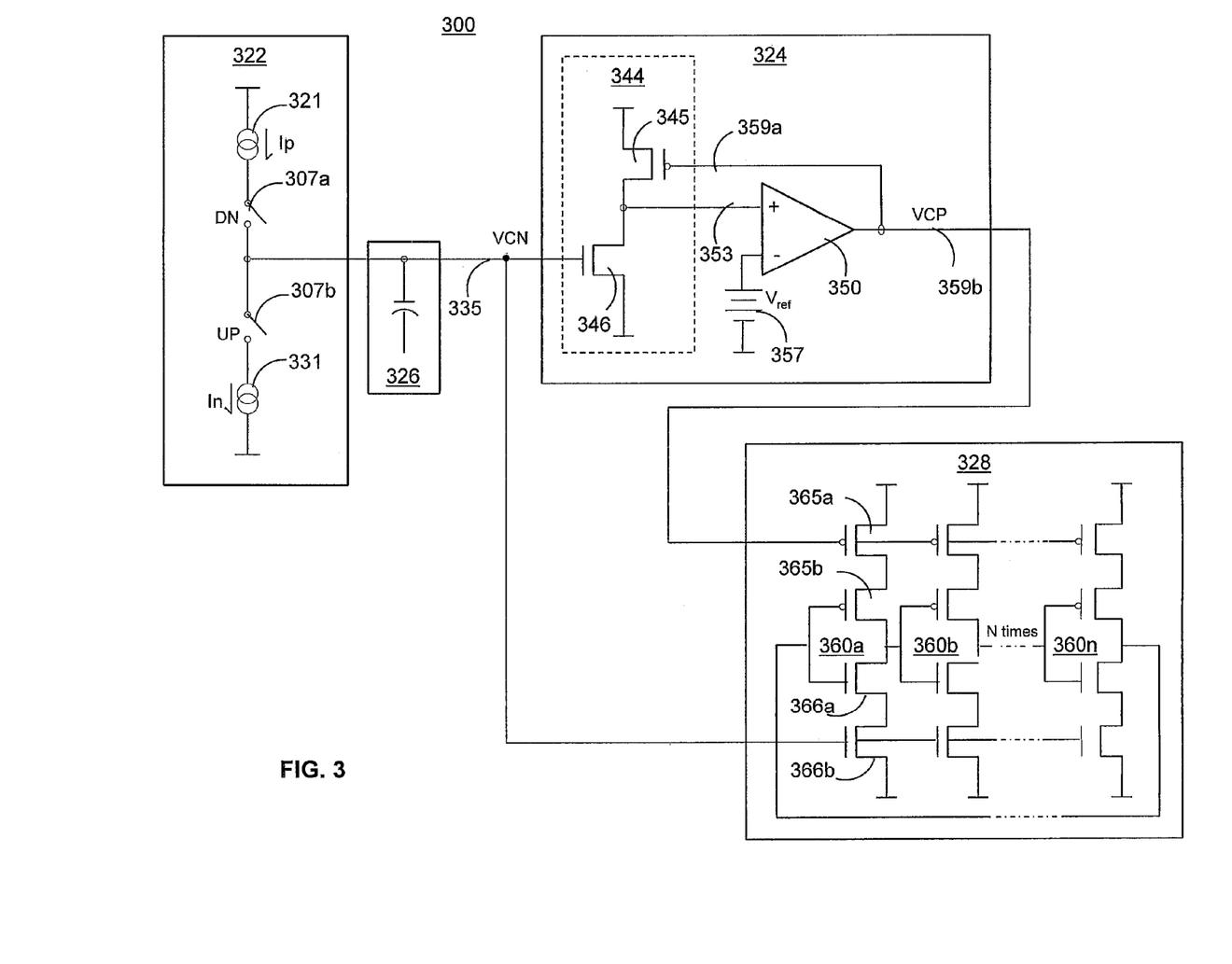
FIG. 3 is a block diagram of a charge pump and VCO interface utilizing a current starved voltage controlled oscillator circuit, according to one embodiment of the invention.

FIG. 3 illustrates CMF and VCO network 300 comprising charge pump circuit 322, filter 326, CMF circuit 324, and current starved ring VCO 328. The circuit of charge pump 322 includes a pair of switches: down switch 307a and up switch 307b. Charge pump 322 produces a single-ended output VCN 335. Current source (Ip) 321 and current sink (In) 331 are also present in charge pump 322. CMF circuit 324 comprises replica circuit 344 which includes p-type transistor 345 and n-type transistor 346 (inverter transistor), and error amplifier 350. Error amplifier 350 provides an output signal of amplifier output 359a and 359b. Error amplifier 350 receives two input signals: a negative input signal of Vref 357 and positive amplifier input voltage (or common mode feedback signal) 353 (which is the replica circuit inverter's output voltage).

VCO 328 comprises a pair of series-connected p-type transistors 365a and 365b connected in series with a pair of n-type transistors 366a and 366b. Current starved ring VCO 328 may comprise n (where n is a variable) number of transistor stages 360a, 360b, and 360n, each composed of a pair of series connected p-type transistors 365a and 365b in series with a pair of series connected n-type transistors 366a and 366b. The gates of n-type transistor 365b and the input of p-type transistor 366a are coupled together.

In one embodiment, down switch A 307a and up switch B 307b are utilized by charge pump 322 to provide VCN 335 to n-type transistor 366b and n-type transistor 346, via filter 326. Amplifier output 359a is input into p-type transistor 345 and amplifier output 359b is input into p-type transistor 365a.

In one embodiment, circuit 344 is a replica of a current starved delay cell from current starved ring VCO 328. Charge pump 322 is a single-ended charge pump with an output utilized to create a first compliment differential voltage leg. The output of charge pump 322, VCN 335, is also necessary to center the common-mode voltage level to interface to current starved ring VCO 328. CMF circuit 324 is utilized as a single-ended to differential translator for charge pump 322. Replica circuit 344 produces a second compliment differential voltage leg with a controlled common-mode voltage level, from a single-ended input voltage (VCN 335). Replica circuit 344 allows optimal common mode centering for current starved ring VCO 328; thereby reducing duty cycle distortion. Inserting replica circuit 344 allows adequate compensation for the common-mode feedback network.

Figure 4:
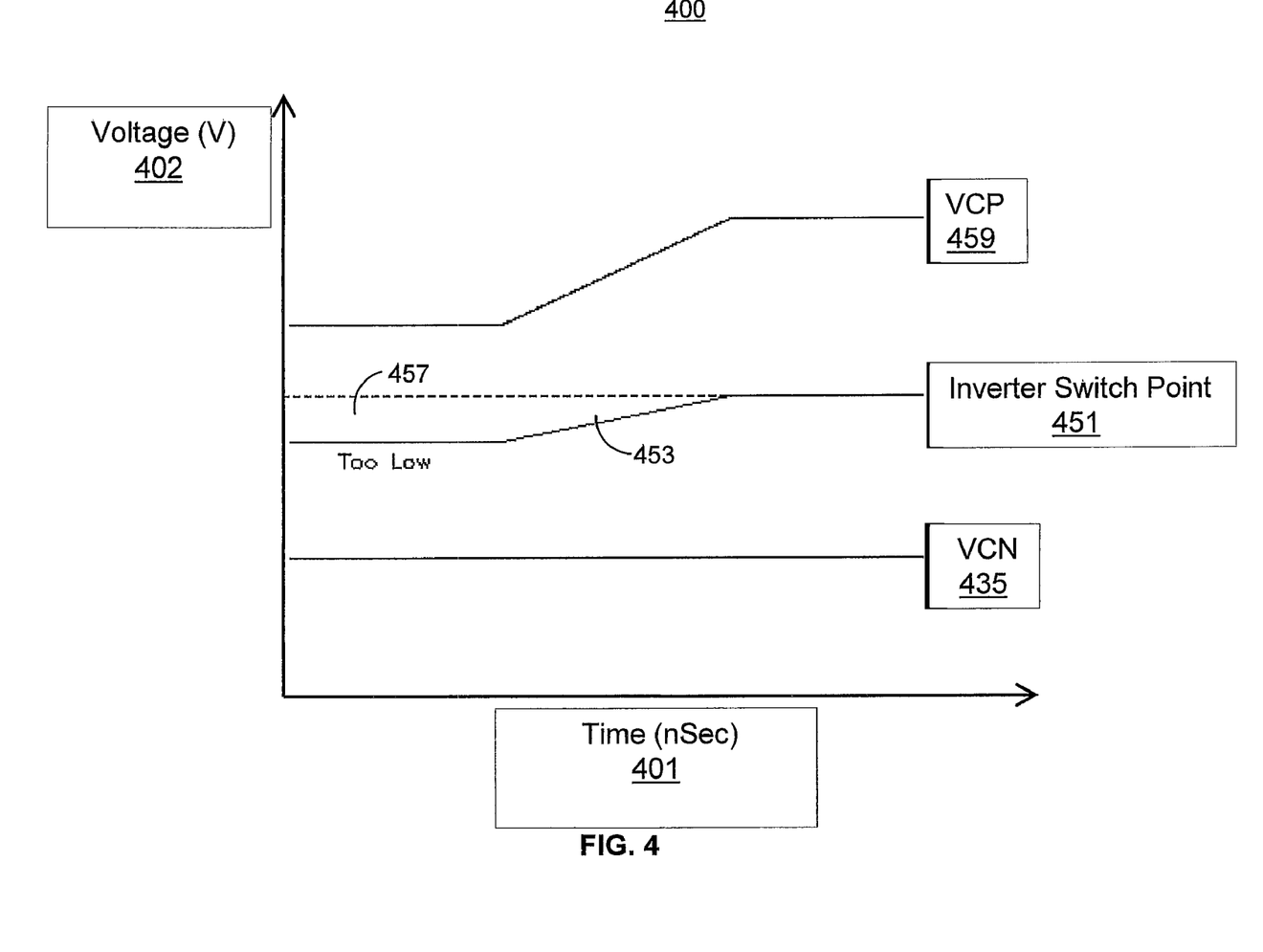
FIG. 4 is a graph charting voltage response to low feedback in a common-mode feedback circuit utilizing a current starved voltage controlled oscillator delay cell, in accordance with one embodiment of the invention.

FIG. 4 illustrates the replica circuit inverter output voltage (positive amplifier input voltage 253 of FIG. 2) response to an initially low feedback voltage in a common-mode feedback circuit utilizing a current starved voltage controlled oscillator delay cell. Low feedback chart 400 comprises time (nSec) 401 along the x-axis and voltage (V) 402 along the y-axis. The chart includes inverter output voltage 453, Vref 457, positive voltage control signal (VCP) 459, negative voltage control signal (VCN) 435, and inverter switch point 451.

In one embodiment, VCN 435 is the input voltage for a common-mode feedback circuit such as CMF circuit 224 (FIG. 2). VCP 459 is the output of an error amplifier, wherein the error amplifier has an input of Vref 457 and inverter output voltage 453. Inverter output voltage 453 is the positive input for the error amplifier and Vref 457 is the negative input for the error amplifier.

In one embodiment, inverter output voltage 453 is too low relative to the inverter switch point 451, and Vref 457 is higher than inverter output voltage 453. When inverter output voltage 453 is low, VCP 459 causes the gate/source voltage of the p-type transistor to increase, thereby increasing the drain current. The drain current of the p-type transistor is connected in series with the drain current of the n-type transistor of the current starved replica circuit. The increased p-type drain current exceeds the drain current of the n-type transistor, causing inverter output voltage 453 to increase until inverter output voltage 453 is equal to Vref 457.

Figure 5:
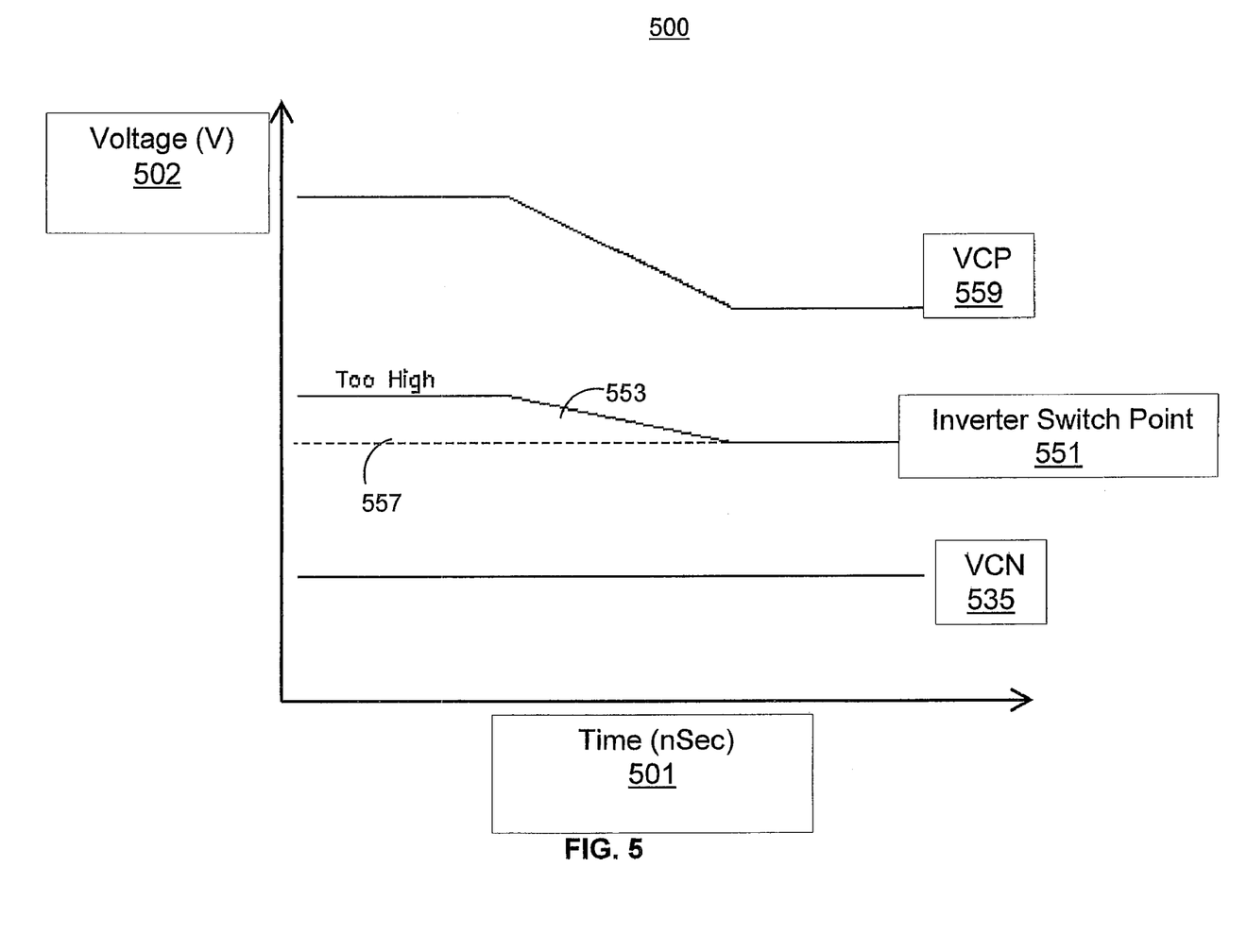
FIG. 5 is a graph charting voltage response to high feedback in a common-mode feedback circuit utilizing a current starved voltage controlled oscillator delay cell, according to one embodiment of the invention.

FIG. 5 illustrates replica circuit inverter output voltage (positive amplifier input voltage 253 of FIG. 2) response to an initially high feedback in a common-mode feedback circuit utilizing a current starved voltage controlled oscillator delay cell. High feedback chart 500 comprises time (nSec) 501 along the x-axis and voltage (V) 502 along the y-axis. The chart describes the transition of inverter output voltage 553 utilizing Vref 557, positive voltage control signal (VCP) 559, negative voltage control signal (VCN) 535, and inverter switch point 551.

In one embodiment, VCN 535 is the input voltage for a common-mode feedback circuit such as CMF circuit 224 (FIG. 2). VCP 559 is the output of an error amplifier, wherein the error amplifier has inputs of Vref 557 and inverter output voltage 553. Inverter output voltage 553 is the positive input for the error amplifier and Vref 557 is the negative input for the error amplifier.

In one embodiment, inverter output voltage 553 is too high at inverter switch point 551, and Vref 557 is lower than inverter output voltage 553. When inverter output voltage 553 is high, VCP 559 causes the gate/source voltage of the p-type transistor to decrease, thereby decreasing the drain current. The drain current of the p-type transistor is connected in series with the drain current of the n-type transistor of the current starved replica circuit. The decreased p-type drain current relative to the drain current of the n-type transistor causes inverter output voltage 453 to decrease until inverter output voltage 453 is equal to Vref 457.

Figure 6:
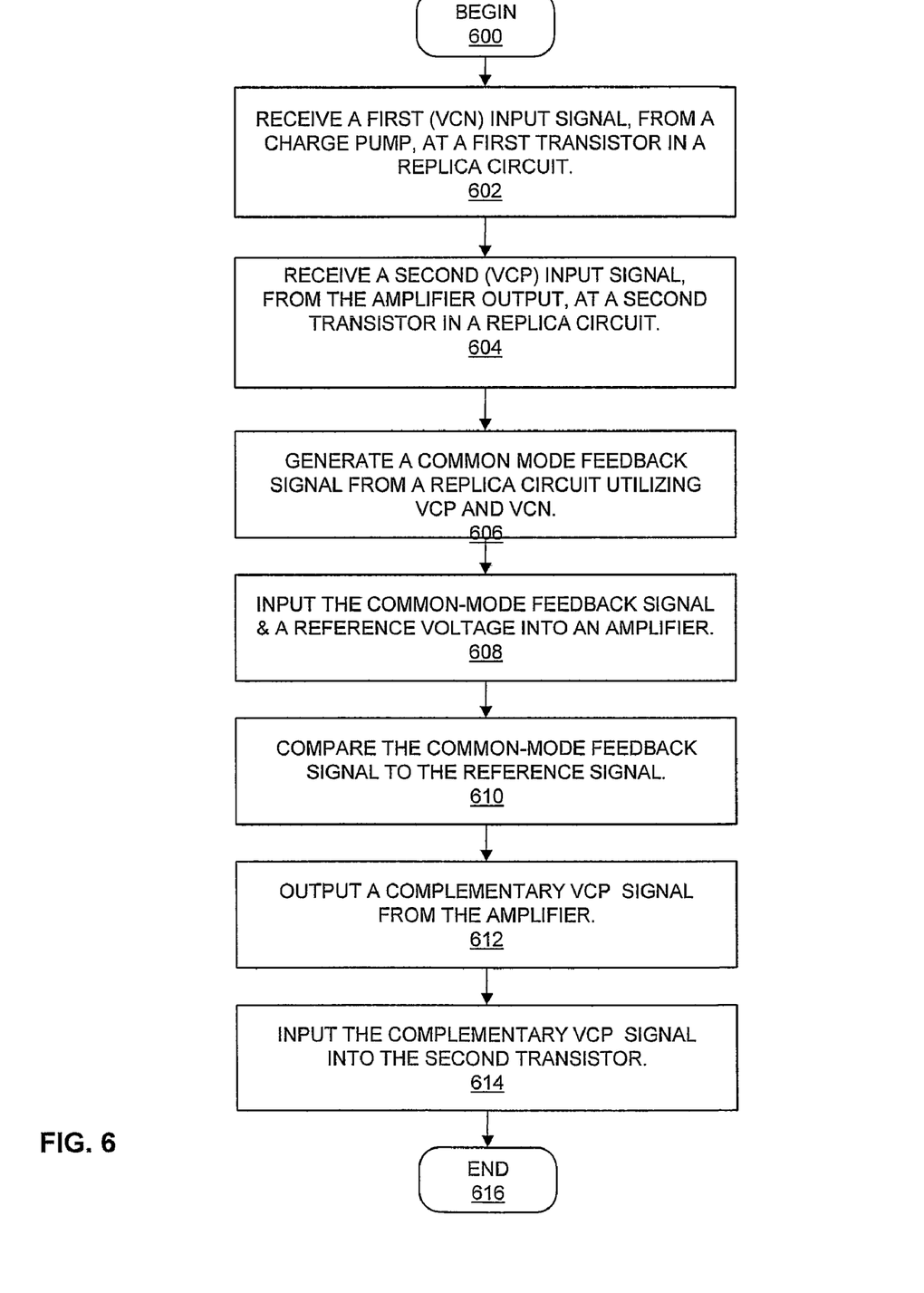
FIG. 6 is a logic flow chart for the method of setting the common-mode voltage level of a charge pump to yield low duty cycle distortion from a VCO, in accordance with one embodiment of the invention.

FIG. 6 is a flow chart illustrating the method for interfacing single-ended charge pump output to differential voltage controlled oscillator (VCO) inputs to yield low duty cycle distortion from a VCO. The process of FIG. 6 begins at initiator block 600 and proceeds to block 602, at which a first input signal (VCN), from the charge pump (222), is received at the first transistor of replica circuit 224 (of FIG. 2) and a VCO. A second input signal (VCP), from the output of amplifier 250 (FIG. 2), is input into a second transistor in a replica circuit, at block 604. A common-mode output level signal is generated by the replica circuit, at block 606, utilizing VCP and VCN. At block 608, the common-mode output level signal (from the replica circuit) and a reference voltage are input into an amplifier. The common-mode output level signal and reference signal are compared utilizing the amplifier, at block 610. At block 612, the VCP signal is derived from the amplifier. The VCP signal is input into the first transistor and into a VCO, at block 614. The process ends at block 616.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. An electronic circuit comprising:
   a phase frequency detector (PFD) receiving a reference clock signal and a feedback signal and providing a PFD output;
   a charge pump having an input coupled to the PFD output and which generates a single-ended output signal;
   a filter having an input coupled to the single-ended output signal and which generates a filtered single-ended output signal;
   a voltage controlled oscillator (VCO) which generates the feedback signal received by the PFD; and
   a common-mode feedback (CMF) circuit, having a replica circuit and an error amplifier and which: (a) receives a single-ended output signal from the charge pump; (b) derives a complementary voltage of the single-ended output to form a differential voltage signal; and (c) centers the differential voltage about a common-mode level; and (d) derives a common-mode feedback signal by providing the single-ended output signal from the charge pump and an error amplifier output as inputs to the replica circuit, which derives a common-mode feedback signal.

2. The electronic circuit of claim 1, wherein:
   the replica circuit comprises a first type transistor and a second type transistor connected in series at an inverter node, connecting respective drain terminals, and yielding the inverter node voltage, wherein the first type transistor is one of a NMOS type (n-type) transistor and the second type transistor is a PMOS type (p-type) transistor; and
   the error amplifier generates a positive voltage control (VCP) signal as an amplifier output, which output is provided as the VCP signal serving as: (a) a gate voltage of a second-type transistor within the VCO; and (b) a gate voltage of a similar type transistor within the replica circuit, wherein the differential voltage is centered about the common-mode level by comparing, with the error amplifier, a common-mode feedback signal and a reference voltage, which are provided as inputs to the error amplifier.

3. The electronic device of claim 2, wherein the error amplifier comprises:
   a first input coupled to a reference voltage (Vref) input;
   a second input coupled to the inverter node of the replica circuit;
   wherein the charge pump generates an output of negative voltage control (VCN) signal, which is filtered and provided as a gate signal for the first-type transistor within the replica circuit;
   wherein said amplifier output is coupled to a gate of the second-type transistor.

4. The electronic circuit of claim 2, wherein:
   the replica circuit is a replica of a current starved delay cell of a VCO; and
   wherein the first-type transistor and second-type transistor within the replica circuit share a same transistor geometric ratio as similar type transistors in the current starved delay cell, such that the second-type transistor is equal to a dividend of a width (W) and a length (L) of the second type transistor, multiplied by a constant, and the first-type transistor ratio is equivalent to the dividend of the width and the length of the first-type transistor.

5. The electronic circuit of claim 2, wherein:
VCN is coupled to a gate terminal of the n-type transistor;
the output of the n-type transistor at the inverter node is coupled to a positive input terminal of the error amplifier; and
the reference voltage is coupled to the negative input terminal of the error amplifier, wherein a value of the reference voltage is adjustable to a transition point of a current starved delay cell inverter.

6. The electronic circuit of claim 2, wherein:
when the inverter node voltage is high, the positive input for the error amplifier is greater than the reference voltage and the high inverter node voltage causes the amplifier output to be positive, wherein a positive amplifier output reduces a gate to source voltage of the p-type transistor, thereby lowering a drain current of the p-type transistor;
wherein when the drain current of p-type transistor is lowered, the inverter node of the n-type transistor pulls toward ground, and decreases the resulting voltage magnitude of the inverter node;
wherein the inverter node voltage continues to adjust, according to the amplifier output, until the inverter node voltage is equivalent to the reference voltage.

7. The electronic circuit of claim 2, wherein:
when the inverter node voltage is low, and the positive input for the error amplifier is less than the reference voltage, the low inverter node voltage forces the amplifier output to be negative, which causes an increase in a drain current of the p-type transistor;
wherein, when the drain current of the p-type transistor is increased, the inverter node voltage of the n-type transistor pulls toward the supply voltage, and increases in voltage magnitude of the inverter node because a current of the n-type transistor is less than the current of the p-type transistor;
wherein the inverter node voltage continues to adjust, according to the amplifier output, until the inverter node voltage is equivalent to the reference voltage.

8. The electronic circuit of claim 2, wherein:
the charge pump circuit includes a pair of control switches and the charge pump produces single-ended output VCN;
wherein the switches include a down switch A and an up switch B utilized by the charge pump to provide VCN to the gates of the n-type transistor of the VCO and n-type transistor of the replica circuit, via the filter;
wherein the n-type transistor is an inverter transistor; and
an output from error amplifier is provided to both the gate of a p-type transistor within the VCO and the gate of the p-type transistor within the replica circuit.

9. The electronic circuit of claim 2, wherein:
the charge pump is a single-ended charge pump with an output utilized to create a first compliment differential voltage;
the output of the charge pump, VCN, is also necessary to drive one of two compliment voltage legs to a differential current starved ring VCO;
the CMF circuit is utilized as a single-ended to differential translator for charge pump, wherein replica circuit produces a second compliment differential voltage and a controlled common-mode voltage level, from a single-ended input voltage, VCN; and
the replica circuit allows optimal common mode centering for current starved ring VCO, thereby reducing VCO output duty cycle distortion.

10. The electronic circuit of claim 1, wherein said CMF circuit provides the functionality of:
receiving a first signal to the first transistor of the replica circuit, wherein the first signal is a negative control voltage (VCN) signal received at a gate of the first transistor;
receiving a second signal to the second transistor of the replica circuit, wherein the second signal is a positive control voltage (VCP) signal received at a gate of the second transistor;
dynamically generating the inverter output signal as an output signal from the replica circuit;
comparing the inverter output signal to the reference voltage;
determining the VCP by comparing the inverter output signal to the reference voltage; and
outputting the VCP signal from the amplifier to the second transistor and the VCO.

11. The electronic circuit of claim 10, wherein said CMF further provides the functionality of:
receiving the inverter node voltage into the positive input of the amplifier;
receiving the reference voltage into the negative input of the amplifier;
comparing the inverter node voltage to the reference voltage; and
determining the VCP signal based on the difference between the inverter node voltage and the reference voltage.

12. The electronic circuit of claim 1, configured as a phase locked loop (PLL) circuit.

13. In an electronic circuit having:
a phase frequency detector (PFD) receiving a reference clock signal and a feedback signal and providing a PFD output;
a charge pump having an input coupled to the PFD output and which generates a single-ended output signal; a filter having an input coupled to the single-ended output signal and which generates a filtered single-ended output signal; and a voltage controlled oscillator (VCO), which generates the feedback signal received by the PFD, a method comprising:
coupling a common-mode feedback (CMF) circuit to the filtered single-ended output signal of the filter, wherein the CMF circuit includes a replica circuit and an error amplifier and the CMF circuit:
  (a) receives a single-ended output signal from the charge pump;
  (b) derives a complementary voltage of the single-ended output to form a differential voltage signal; and
  (c) centers the differential voltage about a common-mode level; and
  (d) derives a common-mode feedback signal by providing the single-ended output signal from the charge pump and an error amplifier output as inputs to a replica circuit, which derives a common-mode feedback signal.

14. The method of claim 13, further comprising:
receiving a first signal to a first transistor of the replica circuit, wherein the first signal is a negative control voltage (VCN) signal received at a gate of the first transistor;

receiving a second signal to a second transistor of the replica circuit, wherein the second signal is a positive control voltage (VCP) signal received at a gate of the second transistor;

dynamically generating an inverter output signal as an output signal from the replica circuit;

comparing the inverter output signal to the reference voltage;

determining the VCP signal by comparing the inverter output signal to the reference voltage at the error amplifier;

outputting the VCP signal, from the amplifier, to both the second transistor and the VCO;

dynamically modifying the inverter output signal when the drain current of the second transistor is modified, wherein modifying the drain current of the second transistor modifies the current of the first transistor; and centering the differential voltage about the common-mode level by comparing, with the error amplifier, a common-mode feedback signal and a reference voltage, which are provided as inputs to the error amplifier.

15. The method of claim 14, wherein said receiving further comprises:

coupling the VCN signal to the gate of the first transistor, wherein the first transistor is a p-type transistor;

coupling the VCP signal to the gate of the second transistor, wherein the second transistor is a n-type transistor; and outputting the inverter output signal from a drain of the p-type transistor and a drain of the n-type transistor, when the drain of the p-type transistor and the drain of the n-type transistor are connected in series.

16. The method of claim 14, further comprising:

inputting the inverter output signal into the positive input of the amplifier;

inputting the reference voltage signal into the negative input of the amplifier;

comparing the inverter output signal to the reference voltage signal; and determining the VCP signal based on the difference between the inverter output signal and the reference voltage signal.

17. The method of claim 14, wherein said dynamically generating the inverter output signal further comprises:

generating a higher VCP signal when the inverter output is higher than the reference voltage;

decreasing a drain current of the p-type transistor when the higher VCP signal is input into the gate of the p-type transistor; and decreasing the inverter output voltage as the drain current of the p-type transistor decreases, when a drain current of the n-type transistor is greater than the drain current of the p-type transistor.

18. The method of claim 14, wherein said dynamically generating the inverter output signal further comprises:

generating a lower VCP signal when the inverter output is lower than the reference voltage;

increasing the drain current of the p-type transistor when the lower VCP signal is input into the gate of the p-type transistor; and increasing the inverter output voltage as the drain current of the p-type transistor increases, when the drain current of the n-type transistor is less than the drain current of the p-type transistor.

19. The method of claim 14, further comprising:

inputting a first VCO signal into a first VCO transistor, when the first VCO transistor is a p-type VCO transistor;

inputting a second VCO signal into a second VCO transistor, when the second VCO transistor is a n-type VCO transistor;

wherein the VCO is a current starved ring VCO comprising: one or more p-type transistors connected in series with one or more p-type transistors, to form a transistor chain, and one or more gates of the p-type transistors are connected to one or more gates of the n-type transistor, within the transistor chain; and connecting the transistor chain to one or more transistor chains, wherein the transistor chains are connected at the gate of the transistor for the current starved ring VCO.

20. The method of claim 14, further comprising:

matching the first transistor width to length ratio to the second transistor in width to length ratios multiplied by a constant;

connecting the first transistor in series with the second transistor, drain to drain, to yield a connecting node at which the node voltage is outputted;

inputting VCN at the gate of the n-type transistor of the replica circuit and inputting VCN at the input of the n-type VCO transistor; and inputting VCP at the gate of the p-type transistor of the replica circuit and inputting VCP at the input of the p-type VCO transistor.

* * * * *